(12) United States Patent
Imai et al.

(10) Patent No.: US 10,923,358 B2
(45) Date of Patent: Feb. 16, 2021

(54) SUBSTRATE PROCESSING METHOD

(71) Applicant: TOKYO ELECTRON LIMITED, Tokyo (JP)

(72) Inventors: Muneyuki Imai, Yamanashi (JP); Akitaka Shimizu, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/999,361

(22) PCT Filed: Feb. 17, 2017

(86) PCT No.: PCT/JP2017/004431
§ 371 (c)(1),
(2) Date: Aug. 17, 2018

(87) PCT Pub. No.: WO2017/141773
PCT Pub. Date: Aug. 24, 2017

(65) Prior Publication Data
US 2019/0109012 A1 Apr. 11, 2019

(30) Foreign Application Priority Data
Feb. 19, 2016 (JP) .............................. JP2016-030365

(51) Int. Cl.
| *H01L 21/3065* | (2006.01) |
| *H01L 21/311* | (2006.01) |
| *H01L 21/762* | (2006.01) |
| *H01L 21/67* | (2006.01) |
| *H01L 21/687* | (2006.01) |
| *H01L 21/321* | (2006.01) |

(52) U.S. Cl.
CPC .... *H01L 21/31116* (2013.01); *H01L 21/3212* (2013.01); *H01L 21/67017* (2013.01); *H01L 21/67167* (2013.01); *H01L 21/68742* (2013.01); *H01L 21/76224* (2013.01)

(58) Field of Classification Search
CPC ............. H01L 21/0234; H01L 21/3065; H01L 21/30655; H01L 21/32136; H01L 21/32137
See application file for complete search history.

(56) References Cited

U.S. PATENT DOCUMENTS

| 4,845,054 A | 7/1989 | Mitchener |
| 2006/0137607 A1* | 6/2006 | Seo ......................... C23C 16/14 118/715 |
| 2009/0191340 A1 | 7/2009 | Tozawa |

(Continued)

FOREIGN PATENT DOCUMENTS

| EP | 0690479 A1 | 1/1996 |
| JP | H8-327959 A | 12/1996 |

(Continued)

*Primary Examiner* — Thomas T Pham
(74) *Attorney, Agent, or Firm* — Fenwick & West LLP

(57) ABSTRACT

In a substrate processing method for etching a silicon oxide layer formed on a surface of a substrate, a surface of the silicon oxide layer is hydrophilized. Then, the silicon oxide layer is etched by supplying a halogen-containing gas to the substrate and sublimating a reaction product generated by reaction between the halogen-containing gas and the silicon oxide layer.

10 Claims, 10 Drawing Sheets

(56) References Cited

U.S. PATENT DOCUMENTS

| | | | |
|---|---|---|---|
| 2009/0308843 A1* | 12/2009 | O'Hara | B81C 1/00476 216/59 |
| 2011/0124144 A1* | 5/2011 | Schlemm | H01J 37/3244 438/57 |
| 2011/0139748 A1 | 6/2011 | Donnelly et al. | |
| 2012/0286346 A1 | 11/2012 | Nakazawa | |
| 2015/0072508 A1* | 3/2015 | Or | H01L 21/326 438/466 |
| 2015/0380495 A1* | 12/2015 | Hikosaka | H01L 29/2003 257/190 |
| 2017/0207076 A1 | 7/2017 | Dobashi et al. | |

FOREIGN PATENT DOCUMENTS

| | | |
|---|---|---|
| JP | H09-223684 | 8/1997 |
| JP | 2003-068766 A | 3/2003 |
| JP | 2009-158774 A | 7/2009 |
| JP | 2009-545460 A | 12/2009 |
| JP | 2012-235059 A | 11/2012 |
| JP | 2016-025111 A | 2/2016 |
| KR | 10-0614290 B1 | 8/2006 |
| KR | 10-0628888 B1 | 9/2006 |
| KR | 10-2011-0138142 A | 12/2011 |
| KR | 10-2015-0060920 A | 6/2015 |
| KR | 10-2016-0001619 A | 1/2016 |
| SG | 10201600021 U | 8/2016 |
| WO | 2008-015434 A1 | 2/2008 |

\* cited by examiner

REFERENCE EXAMPLE

COMPARATIVE EXAMPLE

TEST EXAMPLE

SUBSTRATE PROCESSING METHOD

CROSS-REFERENCE TO RELATED APPLICATIONS

This application is National Stage Application of the PCT Application No. PCT/JP2017/004431, filed on Feb. 7, 2017, entitled "Substrate Processing Method," which claims priority to the Japanese Patent Application No. 2016-030365 filed on Feb. 19, 2016. The entire contents of the foregoing applications are incorporated herein by reference for all purposes.

FIELD OF THE INVENTION

The present invention relates to a substrate processing method for performing etching by supplying a processing gas to a surface of a target substrate.

BACKGROUND OF THE INVENTION

Along with diversification and three-dimensional development of semiconductor devices, the structures of the devices become complicated and miniaturized. Therefore, even in each process of a semiconductor manufacturing process, it is required to deal with various new surface structures and film types. For example, a process of fabricating a transistor of a three-dimensional structure includes a step of forming an $SiO_2$ (silicon oxide) film that is an insulating layer for separating transistors, which includes precursor structure portions of the transistors, and then etching the $SiO_2$ (silicon oxide) film until the precursor structure portions are exposed.

As for a method for etching an $SiO_2$ film, there is known a method using a chemical oxide removal process by HF (hydrogen fluoride) gas and $NH_3$ (ammonia) gas as disclosed in, e.g., Japanese Patent Application Publication No. 2009-156774. In this method, HF gas and $NH_3$ gas are supplied into a processing chamber to etch an $SiO_2$ film formed on a surface of a semiconductor wafer (hereinafter, referred to as "wafer"). These gases react with $SiO_2$ to generate $(NH_4)_2SiF_6$ (ammonium silicon fluoride). $(NH_4)_2SiF_6$ thus generated is sublimated by heating the wafer in the same processing chamber. As a result, $SiO_2$ is removed.

When the miniaturization of a circuit pattern progresses, in an $SiO_2$ film for insulating transistors, a degree of roughness on the surface of the $SiO_2$ film greatly affects leak characteristics. Therefore, there is a demand for improving the surface roughness of the $SiO_2$ film.

Japanese Patent Publication Application No. 2003-68766 discloses a technique of performing plasma processing using plasma obtained by activating $O_2$ to improve wettability for etching at the time of removing an oxide film formed on a surface of a substrate. However, in this technique, the surface roughness after etching is not considered.

SUMMARY OF THE INVENTION

In view of the above, the present invention provides a technique capable of suppressing deterioration of roughness at the time of etching a part of an $SiO_2$ layer formed on a surface of a substrate.

In accordance with an aspect of the present invention, there is provided a substrate processing method for etching a silicon oxide layer formed on a surface of a substrate. The substrate processing method includes: a first step of hydrophilizing a surface of the silicon oxide layer; and a second step of etching the silicon oxide layer by supplying a halogen-containing gas to the substrate and sublimating a reaction product generated by reaction between the halogen-containing gas and the silicon oxide layer.

In the present invention, when the silicon oxide layer formed on the surface of the substrate is etched, the silicon oxide film is etched by a halogen-containing gas after the surface of the silicon oxide layer is hydrophilized. Therefore, the surface of the silicon oxide layer is uniformly etched, and the surface roughness is improved. This mechanism will be described later.

DETAILED DESCRIPTION OF THE EMBODIMENTS

Figure 1:
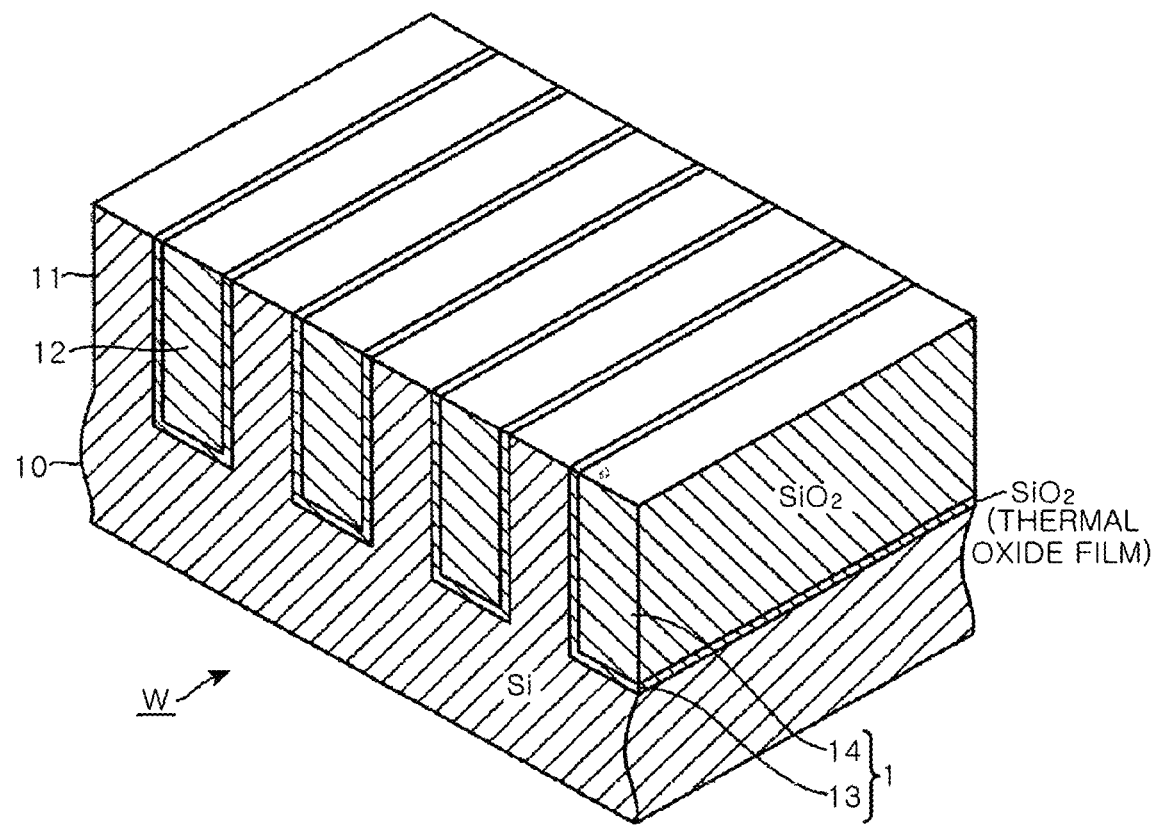
FIG. 1 is a cross sectional perspective view showing a vicinity of a surface of a wafer before etching.

An example of a surface structure of a wafer W that is a target substrate to be processed by a substrate processing method according to an embodiment of the present invention will be described. FIG. 1 shows a surface structure of the wafer W during a semiconductor device manufacturing process. In this surface structure, a plurality of protruding walls 11 extending in parallel to each other is formed by etching an Si (silicon) layer 10. A groove 12 is formed between the protruding walls 11 adjacent to each other. An $SiO_2$ thermal oxide film (first $SiO_2$ film) is formed on the entire surface of the wafer W including inner surfaces of the grooves 12 by heating the wafer W in an oxidizing atmosphere. Then, a second $SiO_2$ film 14 is formed on the entire surface of the wafer W including the inner surfaces of the grooves 12 by, e.g., CVD (Chemical Vapor Deposition) using an organic raw material gas and an oxidizing gas.

Next, the second $SiO_2$ film 14 is treated at high temperature by performing annealing for heating the wafer W at 400° C. to 1000° C. while performing purging by using $N_2$ gas in a vacuum atmosphere. Thereafter, the surface of the wafer W is polished by CMP (Chemical Mechanical Polishing). Accordingly, upper surfaces of the protruding walls 11 are exposed on the surface of the wafer W. FIG. 1 is a cross sectional perspective view showing a surface structure of a wafer W after polishing. In FIG. 1, a thickness of the first SiO$_2$ film 13 is illustrated in an exaggerated manner. Since, however, the first SiO$_2$ film 13 is thin and thus is hardly exposed on the surface. In the following specification, the first SiO$_2$ film 13 and the second SiO$_2$ film 14 are illustrated as an SiO$_2$ film 1. In an embodiment of the present invention, the SiO$_2$ film 1 corresponds to a silicon oxide layer.

Next, the wafer W is transferred to a radical treatment apparatus, and oxygen radicals 102 are supplied to the surface of the wafer W. Specifically, there may be employed, e.g., a method for supplying plasma obtained by activating O$_2$ (oxygen) through an ion trap plate, as will be described later.

Then, the wafer W is transferred to a known COR (Chemical Oxide Removal) treatment apparatus. The SiO$_2$ film 1 is etched by a COR method for removing the SiO$_2$ film 1 by reaction between the SiO$_2$ film 1 and HF molecules 104 and NH$_3$ molecules 105. In the COR treatment apparatus, HF gas and NH$_3$ gas are supplied to the wafer W as will be described later. Accordingly, the HF molecules 104 and the NH$_3$ molecules 105 are adsorbed on the surface of the SiO$_2$ film 1.

Figure 2:
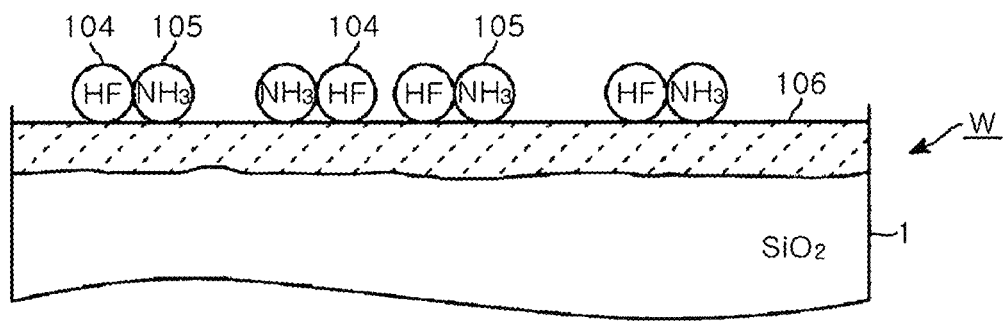
FIGS. 2 and 3 explain an etching state on the surface of the wafer.
Figure 3:
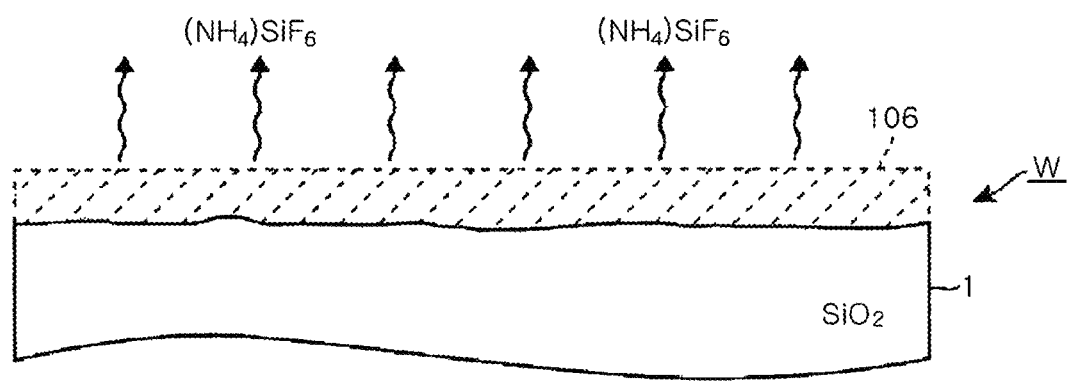
Figure 4:
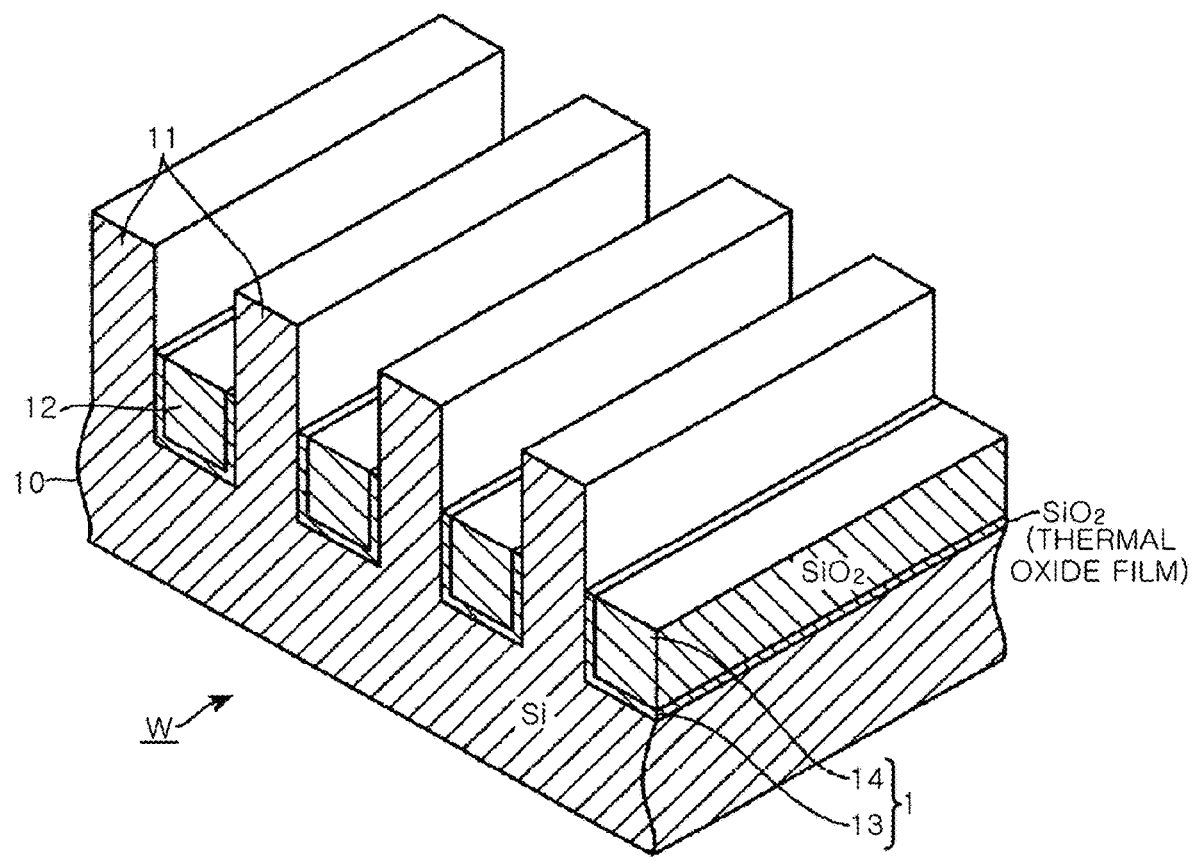
FIG. 4 is a cross sectional perspective view showing the surface of the wafer and therearound after the etching.

When the HF molecules 104 and the NH$_3$ molecules 105 are adsorbed on the surface of the SiO$_2$ film 1, the SiO$_2$ film 1 reacts with the HF molecules 104 and the NH$_3$ molecules 105 as shown in FIG. 2 to generate a reaction product 106, e.g., (NH$_4$)$_2$SiF$_6$, water, and the like. By heating the wafer W to, e.g., 115° C., the reaction product 106 such as (NH$_4$)$_2$SiF$_6$, water, and the like are volatilized (sublimated) and removed as shown in FIG. 3. Thereafter, the supply of the NH$_3$ gas and the HF gas is stopped and a purge gas is supplied to flow. Accordingly, the sublimated reaction product such as (NH$_4$)$_2$SiF$_6$, water, and the like are exhausted by the purge gas, and unreacted HF molecules 104 and unreacted NH$_3$ molecules 105 are removed by the purge gas. Therefore, the reaction between the SiO$_2$ film 1 and the HF molecules 104 and the NH$_3$ molecules 105 is stopped, and the etching is stopped. As a result, the SiO$_2$ film 1 that has become the reaction product 106 is removed and the etching is performed to leave the SiO$_2$ film 1 in the grooves 12 as shown in FIG. 4.

By supplying oxygen radicals to the SiO$_2$ film 1 before the etching of the wafer W having the SiO$_2$ film 1 using the COR method, roughness is improved as can be seen from a test example to be described later.

The reason for improvement of the roughness is presumed as follows. On the surface of the SiO$_2$ film 1 of the wafer W that has been subjected to the CMP shown in FIG. 1, most of hydroxyl groups (OH groups) 101 are removed by at least one of annealing and CMP, and dangling bonds 100 of SiO$_2$ molecules are arranged as shown in FIG. 5.

Figure 6:
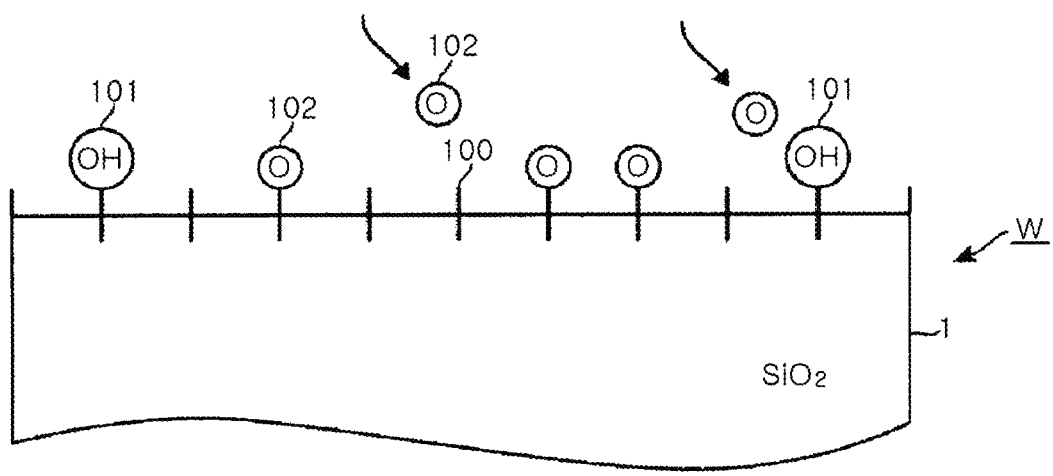
FIGS. 6 and 7 are explanatory views schematically showing the surface of the wafer after oxygen radical treatment.
Figure 7:
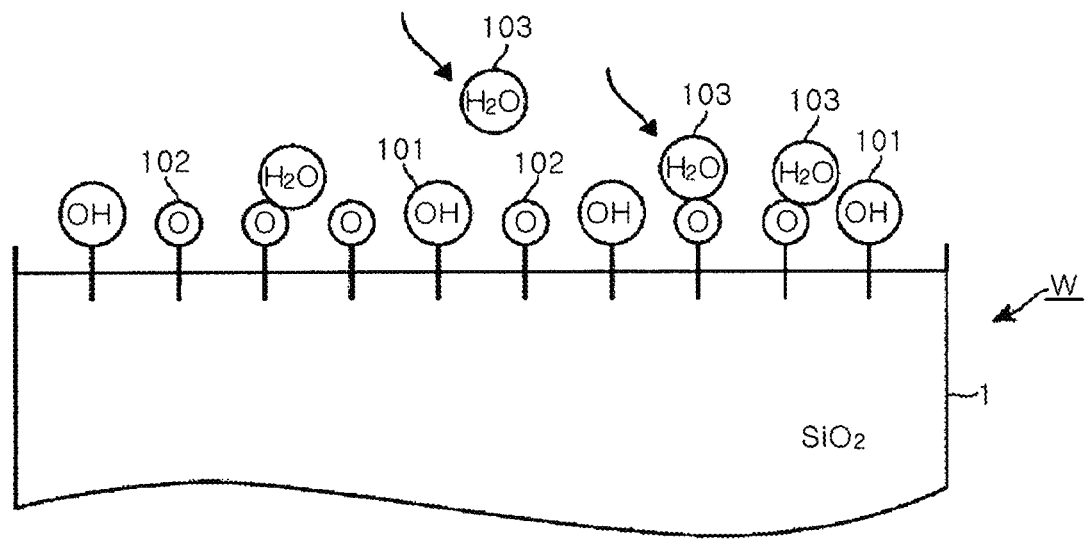

Thereafter, in the radical treatment apparatus, when oxygen radicals are supplied to the wafer W, the oxygen radicals 102 are bonded to the dangling bonds 100 of the SiO$_2$ molecules on the surface of the wafer W as shown in FIG. 6. Then, as shown in FIG. 7, the oxygen radicals 102 bonded to the surface of the wafer W react with surrounding H$_2$O (water) molecule 103 and become OH groups 101. As a result, the entire surface of the SiO$_2$ film 1 is uniformly hydrophilized, and the OH groups 101 are distributed.

Next, in the COR treatment apparatus, HF gas and NH$_3$ gas are supplied. Since the HF molecules 104 and the NH$_3$ molecules 105 are easily adsorbed to the OH groups 101, the HF molecules 104 and the NH$_3$ molecules 105 tend to be adsorbed to the vicinity of the OH groups 101 on the surface of the wafer W.

Figure 5:
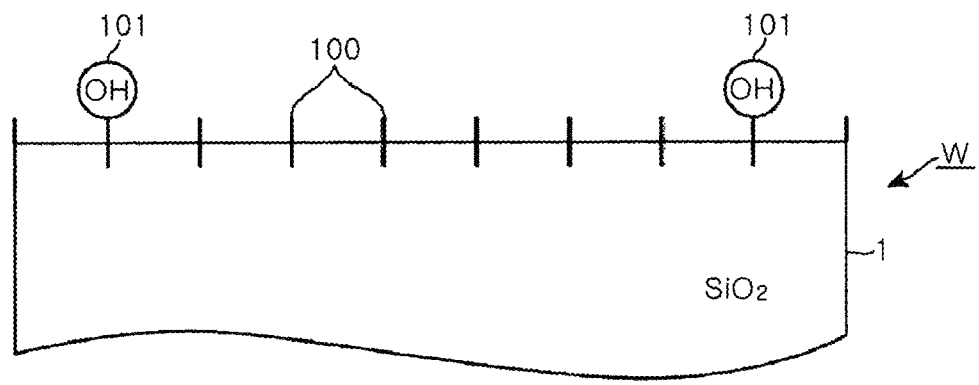
FIG. 5 is an explanatory view schematically showing the surface of the wafer before the etching.
Figure 8:
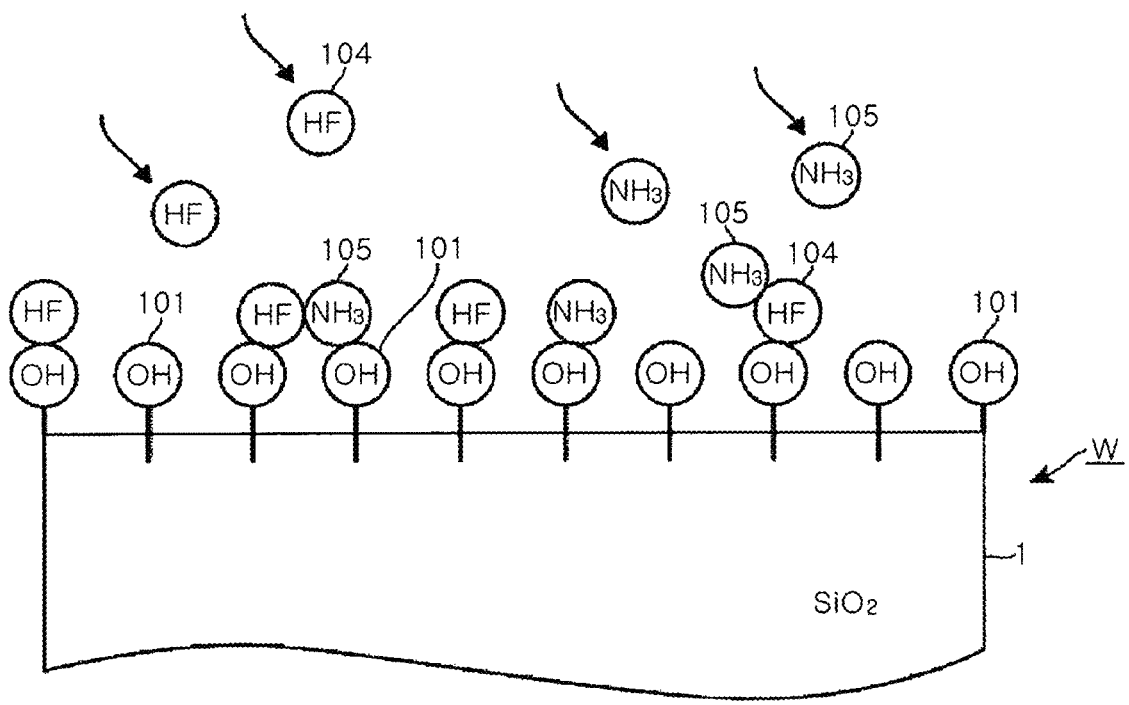
FIG. 8 explains an etching state on the surface of the wafer.

Upon completion of the annealing and the CMP, the OH groups 101 on the surface of the wafer W are distributed sparsely as shown in FIG. 5. Therefore, when the HF gas and the NH$_3$ gas are supplied, the HF molecules 104 and the NH$_3$ molecules 105 are locally adsorbed to portions where the OH groups 101 are bonded on the surface of the wafer W. In this regard, by supplying oxygen radicals to the surface of the SiO$_2$ film 1 and uniformly distributing the OH groups 101 over the entire surface, the HF molecules 104 and the NH$_3$ molecules 105 are uniformly distributed as shown in FIG. 8.

As described above, the HF molecules 104 and the NH$_3$ molecules 105 react with the SiO$_2$ film 1, and the reaction products are sublimated by heating and the SiO$_2$ film 1 is removed by etching. At this time, if the HF molecules 104 and the NH$_3$ molecules 105 are locally adhered to the surface of the SiO$_2$ film 1, the etching is promoted at the portions where the HF molecules 104 and the NH$_3$ molecules 105 are locally adhered, which makes the etching non-uniform. Therefore, when etching is performed to leave the SiO$_2$ film 1 in the grooves 12, the roughness on the surface (surface roughness) of the wafer W after the etching deteriorates.

In this regard, the SiO$_2$ film 1 is uniformly etched by uniformly hydrophilizing the surface of the SiO$_2$ film 1 and allowing the HF molecules 104 and the NH$_3$ molecules 105 to be uniformly adsorbed. Accordingly, it is presumed that the deterioration of the roughness on the surface (surface roughness) of the SiO$_2$ film 1 after the etching is suppressed when the etching is performed to leave the SiO$_2$ film 1.

Figure 9:
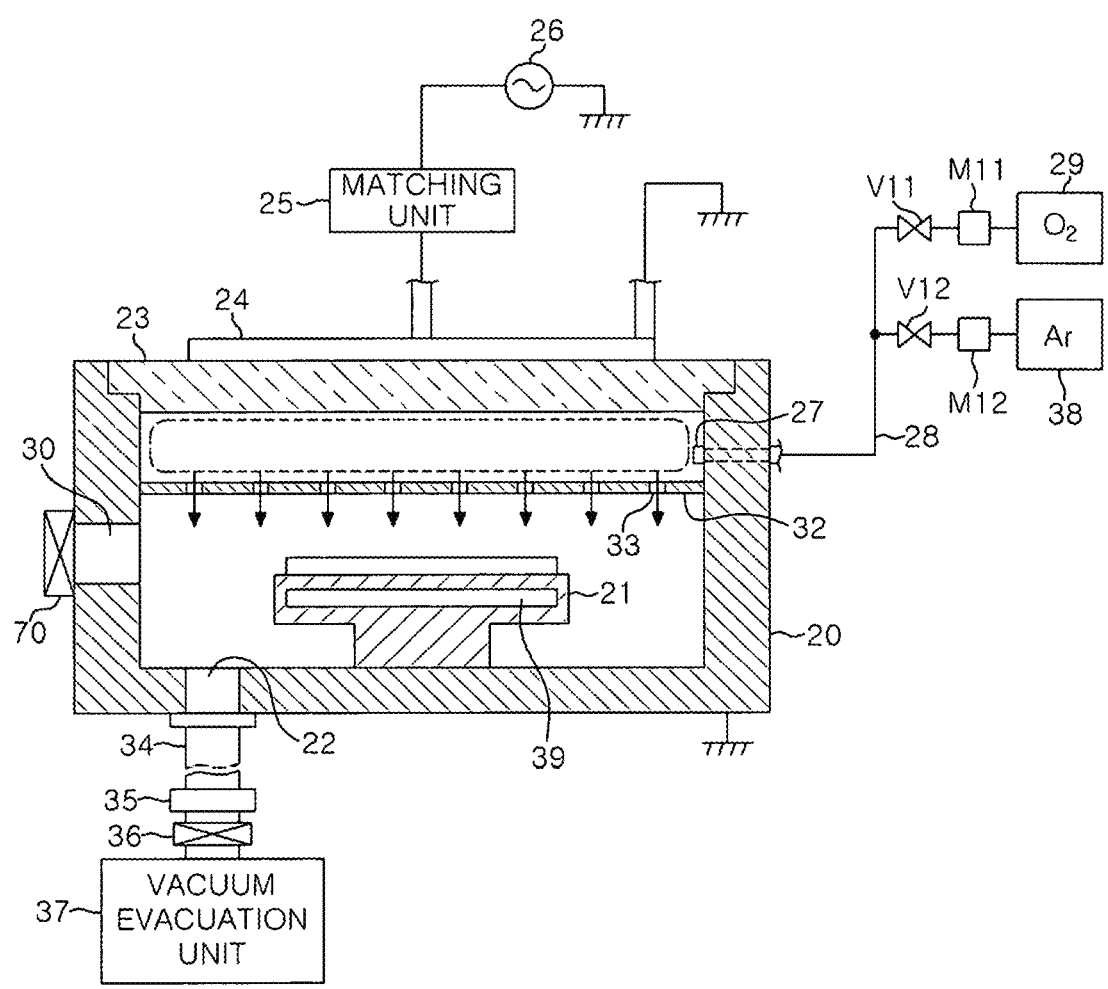
FIG. 9 is a cross sectional view showing a radical treatment apparatus for supplying oxygen radicals to the wafer.

Next, the radical treatment apparatus for performing a process of irradiating the oxygen radical 102 to the surface of the wafer W will be described. As shown in FIG. 9, the radical treatment apparatus includes a grounded processing chamber 20 made of, e.g., stainless steel, and a cylindrical mounting table 21 for mounting thereon the wafer W is provided in the processing chamber 20. For example, a temperature control flow path 39 is formed in the mounting table 21, and a temperature of the wafer W heated by plasma to be described later is adjusted to, e.g., 10° C. to 120° C. The illustration of lifting pins for transferring the wafer W and a lifting mechanism for raising and lowering the lifting pins is omitted. A gas exhaust port 22 is formed at a bottom surface of the processing chamber 20. A gas exhaust line 34 in which a pressure control valve 35 and an opening/closing valve 36 are installed is connected to the gas exhaust port 22. A gas is exhausted through a vacuum evacuation unit 37. A loading/unloading port 30 for loading/unloading the wafer W is provided on a sidewall of the processing chamber 20. A gate valve 70 is provided at the loading/unloading port 30.

A dielectric window 23, e.g., a quartz plate or the like, is provided at a ceiling plate portion of the processing chamber 20 to face the wafer W mounted on the mounting table 21. A high frequency antenna 24 formed of a spiral planar coil is mounted on an upper surface of the dielectric window 23. A high frequency power supply 26 for outputting a high frequency power of, e.g., 200 W to 1200 W, is connected to a central end portion of the coil-shaped high frequency antenna 24 through a matching unit 25. An outer peripheral end portion of the high frequency antenna 24 is grounded.

An ion trap plate 32, e.g., a punching plate made of a conductive member, having through holes 33 is provided below a plurality of gas supply ports 27 and above the mounting table 21 and the loading/unloading port 30 in the processing chamber 20. The ion trap plate 32 adsorbs and traps ions contained in the plasma passing through the through holes 33.

The gas supply ports 27 opened toward the inside of the processing chamber 20 and configured to supply $O_2$ gas and Ar gas to a space between the ion trap plate 32 and the dielectric window 23 are provided on the sidewall of the processing chamber 20. A gas supply line 28 is connected to the gas supply ports 27. The gas supply line 28 is connected to an $O_2$ gas supply source 29 through a valve V11 and a flow rate controller M11 and also connected to an Ar gas supply source 38 for supplying Ar gas as an additional gas through a valve V12 and a flow rate controller M12.

In the above-described radical treatment apparatus, the wafer W is mounted on the mounting table 21 and, then, a pressure in the processing chamber 20 is set within a range from 13.3 Pa to 133 Pa (100 mTorr to 1000 mTorr), e.g., 20 Pa. $O_2$ gas is supplied at a flow rate of 100 sccm to 800 sccm. Ar gas as an additional gas is supplied at a flow rate of 50 sccm to 800 sccm. Accordingly, $O_2$ gas and Ar gas fill a space between the ion trap plate 32 and the dielectric window 23 in the processing chamber 20. Thereafter, the high frequency power of 200 W to 1200 W is applied from the high frequency power supply 26 to the high frequency antenna. As a consequence, $O_2$ gas and Ar gas in the space between the ion trap plate 32 and the dielectric window 23 are excited and turned into plasma. The plasma is moved downward. When the plasma passes through the ion trap plate 32, ions contained in the plasma are removed, and oxygen radicals become main active species to be supplied to the wafer W. Then, the wafer W is exposed to the oxygen radicals for, e.g., 10 sec to 180 sec. At this time, the wafer W is set to about 10° C. to 120° C. Accordingly, the entire surface of the $SiO_2$ film 1 is hydrophilized as described above.

Figure 10:
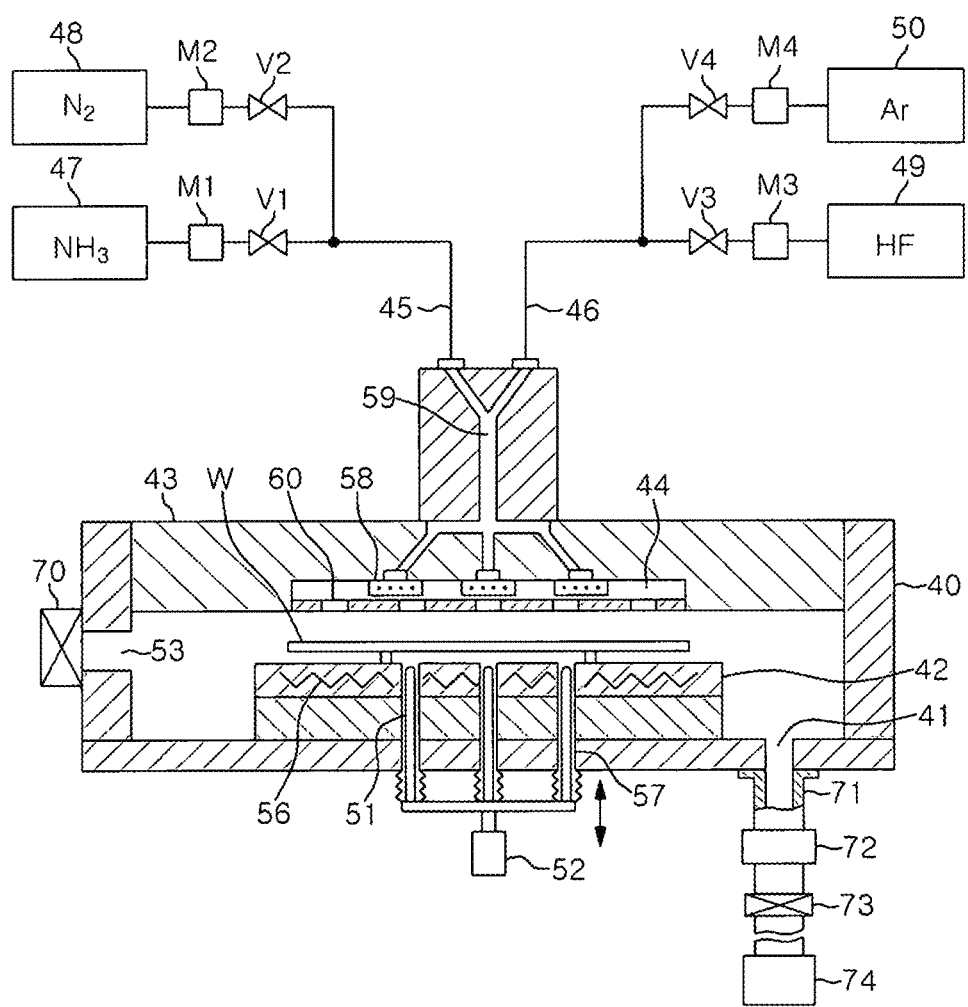
FIG. 10 is a cross sectional view of a COR treatment apparatus for etching an $SiO_2$ film by COR.

Next, an apparatus for supplying oxygen radicals to the wafer W and etching the $SiO_2$ film 1, i.e., a COR treatment apparatus in this example, will be described. As shown in FIG. 10, the COR treatment apparatus includes a processing chamber 40 that is a vacuum chamber. A cylindrical mounting table 42 for mounting the wafer W thereon is provided in the processing chamber 40. A heater 56 forming a heating unit is provided in the mounting table 42. Three through-holes 57 are formed in the mounting table 42 at an equal interval in a circumferential direction. Lifting pins 51 are inserted into the through-holes 57. The lifting pins 51 are movable up and down by a lifting mechanism 52 provided below the processing chamber 40. The wafer W is delivered to the mounting table 42 by cooperation with the lifting pins 51 and an external transfer mechanism. A loading/unloading port 53 for loading/unloading the wafer W is provided on a sidewall of the processing chamber 20, and a gate valve 70 is provided at the loading/unloading port 30.

A gas shower head 43 is provided at an upper portion of the processing chamber 40. The gas shower head 43 is configured to supply a gas dispersed in a dispersion space 44 provided therein toward the wafer W through a diffusion plate 60. A gas supply passage 59 is formed to communicate with the dispersion space 44. An upstream end portion of the gas supply passage 59 is branched into two parts connected to gas supply lines 45 and 46, respectively. In FIG. 10, a reference numeral 58 denotes a diffusion portion for diffusing the gas supplied from the gas supply passage 59 into the distribution space 44.

An upstream side of the gas supply line 45 is branched and connected to an ammonia ($NH_3$) gas supply source 47 and an $N_2$ gas supply source 48 for supplying nitrogen ($N_2$) gas as a dilution gas (carrier gas). An upstream side of the gas supply line 46 is branched and connected to an HF gas supply source 49 and an Ar gas supply source 50 for supplying argon (Ar) gas as a dilution gas (carrier gas). In FIG. 10, notations V1 to V4 denote valves, and notations M1 to M4 dentate flow rate controllers. A gas exhaust port 41 for exhausting an atmosphere in the processing chamber 40 is provided at a bottom surface of the processing chamber 40. A gas exhaust line 71 is connected to the gas exhaust port 41. A gas is exhausted through a vacuum evacuation unit 74. In FIG. 10, reference numerals 72 and 73 denote a pressure control valve and an opening/closing valve, respectively.

In the above-described COR treatment apparatus, the wafer W mounted on the mounting table 42 is heated to 115° C. A pressure in the processing chamber 40 is set to 250 Pa (1.88 Torr). A gas containing HF gas and $NH_3$ gas is supplied toward the wafer W. Accordingly, as described above, the $SiO_2$ film 1 formed on the wafer W reacts with the HF gas and the $NH_3$ gas to generate the reaction product 106, and the reaction product 106 is sublimated and removed by heating.

Figure 11:
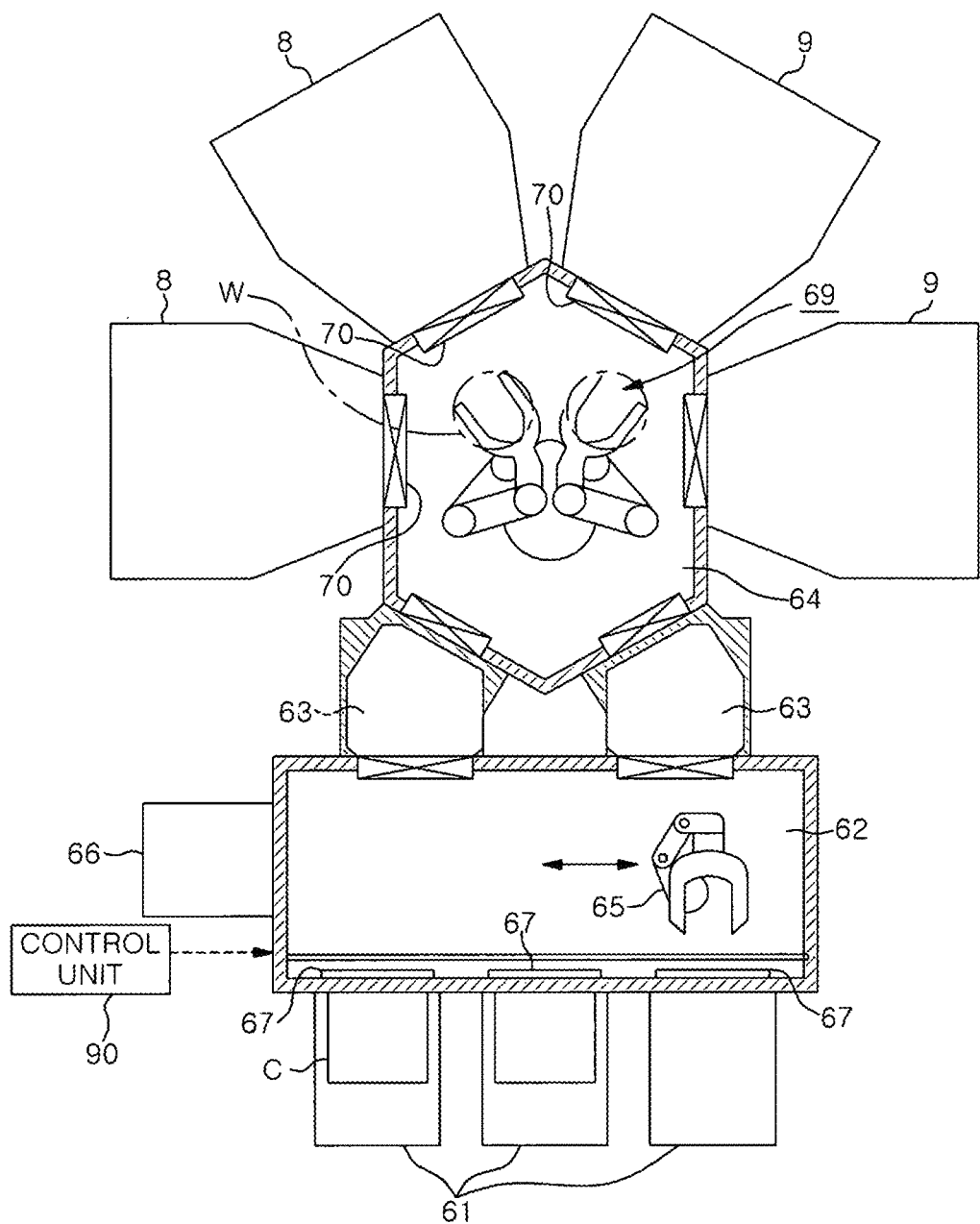
FIG. 11 is a top view showing a vacuum processing apparatus.

The radical treatment apparatus and the COR treatment apparatus are provided at, e.g., a vacuum processing apparatus of a multi-chamber system. As shown in FIG. 11, the vacuum processing apparatus includes a horizontally elongated normal pressure transfer chamber 62 in which a normal pressure atmosphere is set by, e.g., $N_2$ gas. Load ports 61 for delivering wafers W to and from carriers C accommodating wafers W are installed in front of the normal pressure transfer chamber 62. A reference numeral 67 in FIG. 11 denotes an opening/closing door provided on a front wall of the normal pressure transfer chamber 62. A transfer arm 65 for transferring the wafer W is provided in the normal pressure transfer chamber 62. An alignment chamber 66 for adjusting orientation and eccentricity of the wafer W is provided on a left sidewall when viewed from the load port 61 side of the normal pressure transfer chamber 62.

On the side of the normal pressure transfer chamber 62 opposite to the load port 61, two load-lock chambers 63 of which inner atmosphere is switched between a normal pressure atmosphere and a vacuum atmosphere in a state where the wafer W is on standby are arranged side by side. A vacuum transfer chamber 64 is provided behind the load-lock chambers 63 when viewed from the normal pressure transfer chamber 62 side. The vacuum transfer chamber 64 is connected to the load-lock chambers 63, a radical treatment apparatus 8, and a COR processing device 9 through gate valves 70. A transfer arm 69 is provided in the vacuum transfer chamber 64 and transfers the wafer W between the load-lock chambers 63, the radical treatment apparatus 8, and the COR treatment apparatus 9.

The vacuum processing apparatus includes a control unit 90, e.g., a computer. The control unit 90 includes a program, a memory, and a data processing unit having a CPU. The program has a group of commands (steps) so that each step of executing, e.g., radical treatment or etching, can be executed by outputting control signals to the respective components of the vacuum processing apparatus from the control unit 90. This program is stored in a storage unit such as a computer storage medium, e.g., a flexible disk, a compact disk, a hard disk, an MO (magneto-optical disk) or the like, and installed in the control unit 90.

When a transfer carrier C accommodating the wafer W having a surface structure shown in FIG. 1, for example, is loaded onto the load port 61 of the vacuum processing apparatus, the wafer W is taken out from the transfer carrier C and loaded into the alignment chamber 66 via the normal pressure transfer chamber 62 and subjected to alignment. Then, the wafer W is transferred to the vacuum transfer chamber 64 via the load-lock chamber 63. Next, the wafer is transferred to the radical treatment apparatus 8 by the transfer arm 69 and subjected to the above-described radical processing. Then, the wafer W is transferred to the COR treatment apparatus 9 by the transfer arm 69 and subjected to the above-described etching using the COR method. In this manner, the wafer W having the etched $SiO_2$ film is transferred to the load-lock chamber 63 in a vacuum atmosphere by the second transfer arm 69. Thereafter, the atmosphere in the load-lock chamber is switched to the atmospheric atmosphere, and the wafer W is returned to, e.g., the original carrier C, by the transfer arm 65.

The wafer W unloaded from the COR treatment apparatus 9 may be loaded into a heating processing chamber connected to the vacuum transfer chamber 64 and heated therein at a temperature higher than the heating temperature in the COR treatment apparatus 9 to reliably sublimate the reaction product 106.

In accordance with the above-described embodiment, when the $SiO_2$ film 1 formed on the surface of the wafer W is etched to some extent that has not yet reached an underlying layer, the surface of the $SiO_2$ film 1 is irradiated with $O_2$ radicals and hydrophilized. Then, the $SiO_2$ film 1 is etched by $NH_3$ gas and HF gas. Therefore, $NH_3$ gas and HF gas are uniformly adsorbed on the surface of the $SiO_2$ film 1. Accordingly, the surface of the $SiO_2$ film 1 is uniformly etched, and the surface roughness (roughness) is improved.

As for a method for supplying oxygen radicals to the surface of the $SiO_2$ film 1, there may be employed a method for supplying a plasma obtained by activating $O_3$ (ozone) gas or a gaseous mixture of $O_2$ gas and $O_3$ gas, instead of activating $O_2$ gas, to the wafer W through the ion trap plate 32. In addition, as for a method for hydrophilizing the surface of the $SiO_2$ film 1, there may be employed a method using a so-called soft plasma containing active species of oxygen having a low electron temperature without the ion trap treatment of the plasma. As for a hydrophilization method, it is possible to use a method for supplying water vapor to the surface of the wafer W shown in FIG. 1, other than the plasma supply.

In the case of etching the $SiO_2$ film 1, in the COR treatment apparatus shown in FIG. 10, $NH_3$ gas and HF gas are supplied to the wafer W and the reaction product 106 is generated by the reaction between the $SiO_2$ film 1 and the $NH_3$ gas and the HF gas. Then, the wafer W unloaded from the COR treatment apparatus may be transferred to a heating apparatus, and the reaction product 106 may be sublimated by heating the wafer W.

The $SiO_2$ film 1 can be etched by using a processing gas containing a compound of nitrogen, hydrogen and fluorine, e.g., ammonium fluoride ($NH_4F$) gas. In this case as well, the gas reacts with the $SiO_2$ film 1 to generate $(NH_4)_2SiF_6$. Therefore, in the case of etching the wafer W having the $SiO_2$ film 1, ammonium fluoride ($NH_4F$) (or $NH_4FHF$) gas may be supplied. The processing gas may be a gaseous mixture of $NH_3$ gas, HF gas and $NH_4F$ gas (or $NH_4$ FHF).

The method of etching the $SiO_2$ film 1 is not limited to the COR, and plasma etching may be performed. For example, it is possible to generate plasma of a processing gas containing $NF_3$ gas and $NH_3$ gas or plasma of a processing gas containing HF gas and $NH_3$ gas and then supply the plasma to the wafer W through the ion trap plate 32. As for a gas used together with $NH_3$ gas in the etching, a gas containing halogen other than F, such as HBr gas or the like, may be used. Further, ethanol ($C_2H_5OH$) or water ($H_2O$) may be used instead of $NH_3$ gas.

Even when the $SiO_2$ film 1 is completely removed and the underlying layer is exposed, the roughness may be transferred to the surface of the underlying layer at the time of etching the $SiO_2$ film 1. Therefore, the present invention is effective even in the case of completely removing the $SiO_2$ film 1.

TEST EXAMPLES

In order to verify the effect of the present invention, the wafer W was etched and the uniformity of the surface was evaluated.

In a test example, an $SiO_2$ film was formed by CVD using, e.g., an organic raw material gas and an oxidizing gas, on the surface of a wafer W and, then, annealing was performed by heating the wafer W to 400° C. to 1000° C. while performing purging using $N_2$ gas in a vacuum atmosphere. A sample shown in FIG. 1 was obtained by polishing the surface by CMP. As in the above-described embodiment, oxygen radicals were supplied for 180 sec to the sample by the radical treatment apparatus shown in FIG. 9. Then, the etching using HF gas and $NH_3$ gas was performed by the COR treatment apparatus shown in FIG. 10, and the $SiO_2$ film 1 was etched to some extent. In a comparative example, the same treatment as that in the test example was performed except that oxygen radicals were not irradiated.

In each of the test example and the comparative example, the roughness (root mean square roughness) of the surface of the wafer W after the etching was measured. As a reference example, the $SiO_2$ film 1 was formed by CVD and, then, the annealing and the polishing using CMP were performed. Then, the roughness (root mean square roughness) of the surface of the wafer W was measured.

The root mean square roughness (hereinafter, referred to as "average roughness RMS") is obtained by subtracting a reference length e from a roughness curve in a direction of an average line, setting the direction of the average line of the reference length e to the X-axis and a direction of longitudinal magnification to the Y-axis and summing the root mean square of the deviation from an average line of the reference length e to a measurement curve. When the roughness curve is expressed by y=f(x), RMS can be obtained by the following equation.

$$\text{RMS} = \sqrt{\frac{1}{\ell}\int_{c}^{r} f'(x) dx}$$

A sample of the test example, a sample of the comparative example and a sample of the reference example were prepared, and the average roughness RMS in each sample was measured.

Figure 12:
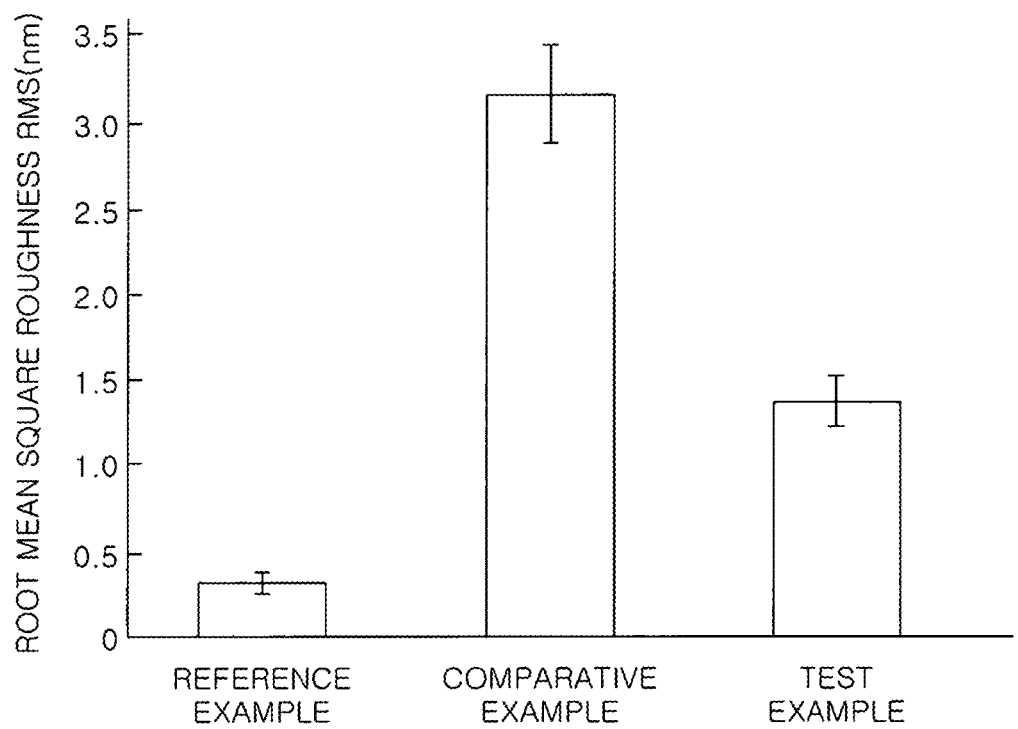
FIG. 12 is a characteristic diagram showing a root mean square roughness in a test example, a comparative example and a reference example.
Figure 13:
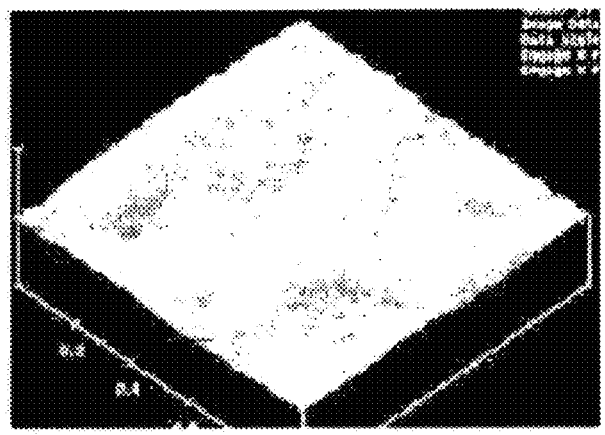
FIG. 13 shows images of the surface of the wafer in the test example, the comparative example and the reference example.
Figure 13:
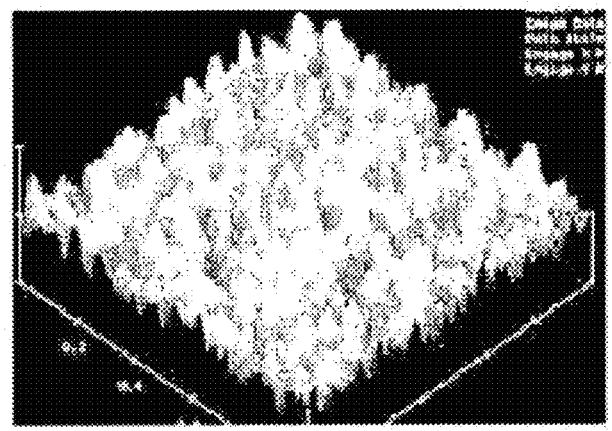
Figure 13:
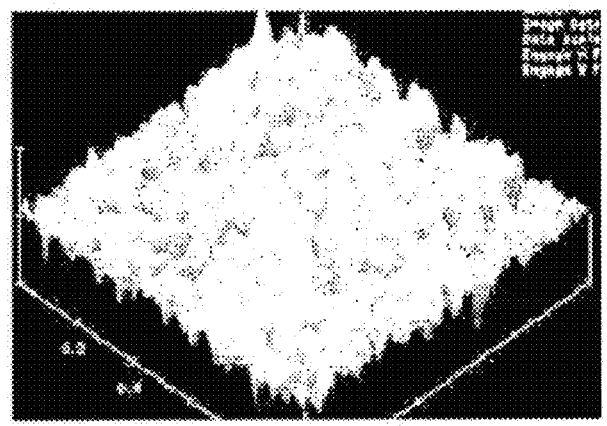

FIG. 12 shows the results thereof, i.e., the average surface roughnesses RMS in the test example, the comparative example and the reference example. An error line in FIG. 12 shows system deviation at the time of AFM (Atomic Force Microscope) measurement. FIG. 13 shows images of the surface of the wafer W in the reference example, the comparative example, and the test example. As shown in FIG. 12, the average surface roughness RMS of the surface of the wafer W in the reference example was 0.298; the RMS in the comparative example was 3.108; and the RMS in the test example was 1.313. As shown in FIG. 12, irregularities were hardly observed in the reference example; large irregularities were observed in the comparative example; and irregularities in the test example were smaller than those in the comparative example.

According to the result, the surface roughness deteriorates by polishing the $SiO_2$ film 1 by CMP and etching the $SiO_2$ film 1 to some extent by using HF gas and $NH_3$ gas. However, the roughness deterioration of the surface is improved by 58% by irradiating the surface of the $SiO_2$ film 1 with oxygen radicals before the etching is performed by using HF gas and $NH_3$ gas.

Therefore, in accordance with the present invention, when the surface of the $SiO_2$ film 1 is etched, the deterioration of the surface roughness can be suppressed.

What is claimed is:

1. A substrate processing method comprising:
   etching a part of a silicon oxide layer formed on a surface of a substrate to leave a remaining part of the silicon oxide layer on the surface of the substrate, said etching including:
   a first step of hydrophilizing a surface of the silicon oxide layer on which dangling bonds of $SiO_2$ molecules are arranged; and
   a second step of etching the remaining part of the silicon oxide layer by supplying a halogen-containing gas to the substrate and sublimating a reaction product generated by reaction between the halogen-containing gas and the silicon oxide layer,
   wherein in the first step, a plasma passes through an ion trap member having a plurality of gas through holes to generate oxygen radicals and the oxygen radicals are bonded to the dangling bonds of $SiO_2$ molecules by supplying the oxygen radicals to the surface of the silicon oxide layer, and
   wherein said etching the part of the silicon oxide layer forms a groove in the substrate, the remaining part of the silicon oxide layer being disposed in the groove.

2. The substrate processing method of claim 1, wherein the plasma is generated by activating at least one of oxygen gas and ozone gas.

3. The substrate processing method of claim 1, wherein the second step is a step of exposing the surface of the silicon oxide layer to at least one of a processing gas containing a hydrogen fluoride gas and an ammonia gas and a processing gas containing a compound of nitrogen, hydrogen and fluorine.

4. The substrate processing method of claim 1, wherein in the second step, the silicon oxide layer is etched by plasma obtained by activating a gaseous mixture of a nitrogen trifluoride gas or a hydrogen fluoride gas and an ammonia gas.

5. The substrate processing method of claim 1, wherein the silicon oxide layer is deposited by reaction between a raw material gas and an oxidizing gas.

6. The substrate processing method of claim 1, wherein in the first step, the substrate is exposed to the oxygen radicals for 10 to 180 seconds while the temperature of the substrate is 10 to 120° C.

7. The substrate processing method of claim 1, wherein, after the part of the silicon oxide layer is etched to leave the remaining part of the silicon oxide layer on the surface of the substrate, the supplying of the halogen-containing gas is stopped and a purge gas is supplied to the substrate to stop the etching.

8. The substrate processing method of claim 1, wherein the plasma includes ions and the ions are absorbed in the ion trap member as the plasma passes through the ion trap member such that the plasma that exists the ion trap member lacks the ions.

9. The substrate processing method of claim 1, wherein in the first step the surface of the silicon oxide layer is uniformly hydrophilized in its entirety.

10. A substrate processing method comprising:
    etching a part of a silicon oxide layer formed on a surface of a substrate to leave a remaining part of the silicon oxide layer on the surface of the substrate, said etching including:
    a first step of hydrophilizing a surface of the silicon oxide layer on which dangling bonds of $SiO_2$ molecules are arranged; and
    a second step of etching the part of the silicon oxide layer by supplying a halogen-containing gas to the substrate and sublimating a reaction product generated by reaction between the halogen-containing gas and the silicon oxide layer,
    wherein in the first step, a plasma passes through an ion trap member having a plurality of gas through holes to generate oxygen radicals and the oxygen radicals are bonded to the dangling bonds of $SiO_2$ molecules by supplying the oxygen radicals to the surface of the silicon oxide layer, wherein the method further comprises:
    before said hydrophilizing the surface of the silicon oxide layer,
    annealing the silicon oxide layer; and
    polishing and planarizing the silicon oxide layer.

* * * * *